(12) United States Patent
Ou et al.

(10) Patent No.: US 11,795,570 B2
(45) Date of Patent: Oct. 24, 2023

(54) SINGLE CRYSTAL FURNACE

(71) Applicants: JINKO SOLAR CO., LTD., Jiangxi (CN); ZHEJIANG JINKO SOLAR CO., LTD, Zhejiang (CN)

(72) Inventors: Ziyang Ou, Jiangxi (CN); Xiaolong Bai, Jiangxi (CN); Xinyu Zhang, Jiangxi (CN)

(73) Assignees: JINKO SOLAR CO., LTD., Jiangxi (CN); ZHEJIANG JINKO SOLAR CO., LTD, Haining (CN)

( * ) Notice: Subject to any disclaimer, the term of this patent is extended or adjusted under 35 U.S.C. 154(b) by 89 days.

(21) Appl. No.: 17/126,657

(22) Filed: Dec. 18, 2020

(65) Prior Publication Data

US 2022/0170177 A1     Jun. 2, 2022

(30) Foreign Application Priority Data

Nov. 30, 2020   (CN) .......................... 202011384456.4

(51) Int. Cl.
*C30B 15/14* (2006.01)
*C30B 35/00* (2006.01)

(52) U.S. Cl.
CPC .............. *C30B 15/14* (2013.01); *C30B 35/00* (2013.01); *Y10T 117/00* (2015.01)

(58) Field of Classification Search
CPC ......... C30B 15/14; C30B 29/06; C30B 35/00; Y10T 117/00
See application file for complete search history.

(56) References Cited

U.S. PATENT DOCUMENTS

| | | | |
|---|---|---|---|
| 5,580,171 A | 12/1996 | Lim et al. | |
| 2004/0211358 A1 | 10/2004 | Fickett et al. | |
| 2007/0235574 A1* | 10/2007 | Schaefer | B07C 5/08 241/36 |
| 2008/0135516 A1* | 6/2008 | Yokogawa | C30B 25/08 216/37 |
| 2012/0228081 A1 | 9/2012 | Tadokoro et al. | |
| 2012/0266808 A1* | 10/2012 | Luter | C30B 29/06 117/216 |

(Continued)

FOREIGN PATENT DOCUMENTS

| | | |
|---|---|---|
| CN | 102433585 A | 5/2012 |
| CN | 102677147 A | 9/2012 |

(Continued)

*Primary Examiner* — Hua Qi
(74) *Attorney, Agent, or Firm* — FORGE IP, PLLC

(57) ABSTRACT

A single crystal furnace is provided, including a main furnace chamber; an auxiliary furnace chamber communicating with the main furnace chamber; and a material chamber provided with a charging inlet and a charging mechanism, wherein the material chamber is communicated with the main furnace chamber through the charging inlet, the charging mechanism is telescopically coupled to the charging inlet for charging materials into a crucible in the main furnace chamber. In the single crystal furnace, the material chamber is provided, so that charging operation may be performed during taking out the monocrystalline silicon rod, thereby effectively shortening the time consumed by taking out the monocrystalline silicon rod and the charging operation, and improving production efficiency.

13 Claims, 8 Drawing Sheets

(56) References Cited

U.S. PATENT DOCUMENTS

2016/0090667 A1\* 3/2016 Buzniak ............... C30B 35/007
                                                        117/214
2018/0066377 A1   3/2018 Hayashi et al.

FOREIGN PATENT DOCUMENTS

| CN | 103194792 A | 7/2013 | | |
|---|---|---|---|---|
| CN | 207091550 U | 3/2018 | | |
| CN | 208201168 U | 12/2018 | | |
| CN | 109306510 A | 2/2019 | | |
| CN | 109306516 A | \* 2/2019 | ............ | C30B 15/02 |
| CN | 109306516 A | 2/2019 | | |
| CN | 111074336 A | 4/2020 | | |
| CN | 212128337 U | 12/2020 | | |
| WO | WO2012120723 A1 | 9/2012 | | |
| WO | WO2017147363 A1 | 8/2017 | | |

\* cited by examiner

SINGLE CRYSTAL FURNACE

CROSS-REFERENCE TO RELATED APPLICATIONS

The present application claims priority to Chinese Patent Application No. 202011384456.4, filed on Nov. 30, 2020, the content of which is incorporated herein by reference in its entirety.

TECHNICAL FIELD

The present disclosure relates to the field of monocrystalline silicon preparation technologies and, in particular, to a single crystal furnace.

BACKGROUND

A Czochralski single crystal furnace generally includes a main furnace chamber and an auxiliary furnace chamber located above the main furnace chamber. During operation, a silicon material is required to be filled into a crucible in the main furnace chamber through the auxiliary furnace chamber, and a monocrystalline silicon rod is pulled through a series of processes. After the monocrystalline silicon rod is taken out from the auxiliary furnace chamber, the crucible is further filled with the silicon material from top to bottom through the auxiliary furnace chamber, and the pulling process of the monocrystalline silicon rod is then performed again.

For the above-mentioned single crystal furnace, after one monocrystalline silicon rod is pulled, the monocrystalline silicon rod is required to be taken out before further charging the crucible. This process greatly wastes production time, thereby adversely affecting production efficiency.

SUMMARY

The present disclosure provides a single crystal furnace in order to solve the above-mentioned problem of low production efficiency of the conventional single crystal furnace.

The present disclosure provides a novel single crystal furnace, including a main furnace chamber; an auxiliary furnace chamber communicating with the main furnace chamber; and a material chamber provided with a charging inlet and a charging mechanism, wherein the material chamber is communicated with the main furnace chamber through the charging inlet, the charging mechanism is telescopically coupled to the charging inlet for charging materials into a crucible in the main furnace chamber.

In an embodiment, the charging mechanism includes a material feeding tunnel and a slide member that are slidably connected to each other, and the material feeding tunnel is telescopically coupled to the charging inlet by the slide member.

In an embodiment, a material chute is formed in the material feeding tunnel, and the material chute has a cross section of an arc shape or a rectangular shape.

In an embodiment, the charging mechanism further includes a thermal insulation mechanism slidably provided on the material feeding tunnel, and the thermal insulation mechanism is sealingly cooperated with the charging inlet.

In an embodiment, the thermal insulation mechanism includes a thermal insulation structure and a pushrod detachably connected to the thermal insulation structure.

In an embodiment, the thermal insulation structure is provided with a guide hole and a rotation hole axially communicated with the rotation hole, an end surface of the thermal insulation structure is exposed at a side of the guide hole, and the rotation hole has a radial dimension greater than the guide hole, and a connection portion is provided at an end of the pushrod, the connection portion passes through the guide hole and is then clamped in the rotation hole.

In an embodiment, a material chute is formed in the material feeding tunnel, and the thermal insulation structure is slidably connected to the material chute, and a boss is provided on a side wall of the thermal insulation structure, and the thermal insulation structure is lapped on an edge of the material chute by the boss.

In an embodiment, a thermal insulation box and a thermal insulation cover plate are fixedly provided in the main furnace chamber, a charging passage and a sealing passage are provided on the thermal insulation box, the charging passage abuts with the charging inlet, and the sealing passage is communicated with the charging passage, and a sealing plug is provided on the thermal insulation cover plate and sealingly cooperates with the sealing passage for opening or blocking the charging passage.

In an embodiment, a heat insulation valve is provided at a position of the main furnace chamber aligned with the charging inlet.

In an embodiment, the material chamber is further provide with a vibration platform and a vibration generator, a dynamic end of the vibration generator is connected to the vibration platform, and the vibration platform is connected to the material feeding tunnel.

In an embodiment, the material chamber is further provided with a charging barrel located above the material feeding tunnel, and a discharge hole is provided at the bottom of the charging barrel and facing the material feeding tunnel.

In an embodiment, the material chamber is provided at a side of the main furnace chamber, and a side wall surface of the charging barrel facing away from the main furnace chamber is a vertical plane that forms a side wall of the discharge hole.

In an embodiment, the charging barrel is provided with a heater.

In an embodiment, the material chamber is further provided with a crushing mechanism located between the charging barrel and the material feeding tunnel.

In an embodiment, the crushing mechanism includes a driving mechanism, an active roller and a passive roller, the active roller is provided with a first tooth, the passive roller is provided with a second tooth meshed with the first tooth, and the driving mechanism is configured to drive the active roller and the passive roller to rotate toward each other.

Technical solutions according to embodiments of the present disclosure may achieve the following technical effects:

In the single crystal furnace according to the present disclosure, by providing the material chamber, the single crystal furnace may achieve the charging operation during taking out the monocrystalline silicon rod, so that the time consumed by taking out the monocrystalline silicon rod and the charging operation is effectively shortened, thereby improving production efficiency.

It is appreciated that, the above general description and the following detailed description are only exemplary, which shall not be interpreted as limiting the present disclosure.

BRIEF DESCRIPTION OF DRAWINGS

In order to better illustrate technical solutions of embodiments of the present disclosure or the technical solutions in the related art, the accompanying drawings used in the embodiments are described below. The drawings described below merely show a part of the embodiments of the present disclosure. Based on these drawings, those skilled in the art may obtain other drawings without creative effort.

Figure 1:
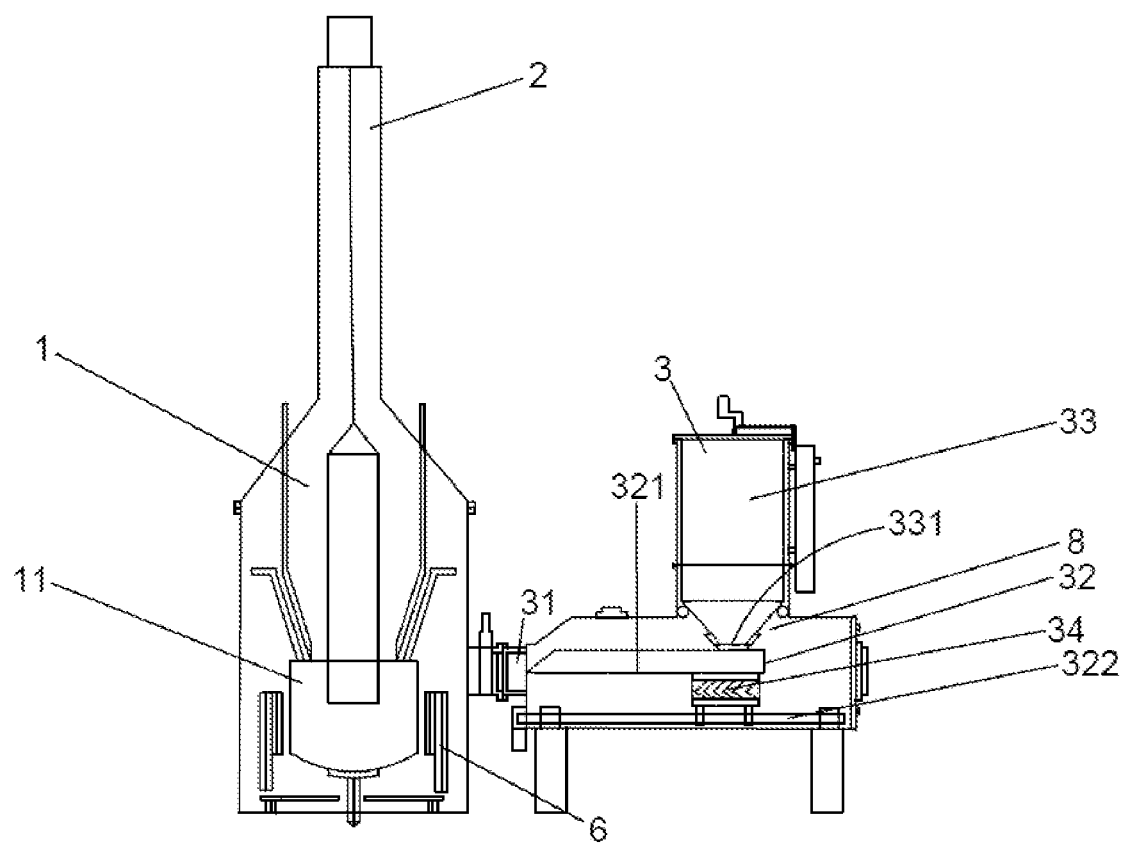
FIG. 1 is a structural schematic diagram showing a single crystal furnace according to an embodiment of the present disclosure.

The drawings here are incorporated into the specification and constitute a part of the specification, which show embodiments of the present disclosure, and are used to explain principle of the present disclosure together with the specification.

DESCRIPTION OF EMBODIMENTS

In order to better illustrate the objectives, technical solutions and advantages of the present disclosure, the present disclosure will be described in further detail below with reference to the accompanying drawings and embodiments. It should be understood that the specific embodiments described herein are only used to explain the present disclosure but are not used to limit the present disclosure.

In the present disclosure, unless specified or limited otherwise, terms such as "first" and "second" are used herein for purposes of description and are not intended to indicate or imply relative importance or significance; unless specified or limited otherwise, the term "a plurality of" refers to two or more; the terms "connected", "fixed" and the like shall be understood broadly, and may be, for example, fixed connections, detachable connections, or integral connections or electrical connections, they may also be direct connections or indirect connections via intervening structures, which may be understood by those skilled in the art according to specific situations.

It should be understood that the terms such as "above" and "under" described in the embodiments of the present disclosure should be construed as referring to the orientation as shown in the drawings, but should not be construed as limiting the embodiments of the present disclosure. In addition, in the context, it also should be understood that when an element is connected "above" or "under" another element, it may be directly connected "above" or "under" the other element, and may also be indirectly connected "above" or "under" another element through an intermediate element.

As shown from FIG. 1 to FIG. 12, novel single crystal furnace(s) can be provided according to some embodiments of the present disclosure. As shown in FIG. 1, the single crystal furnace includes a main furnace chamber 1, an auxiliary furnace chamber 2 and a material chamber 3. The auxiliary furnace chamber 2 is communicated with the main furnace chamber 1. The material chamber 3 is provided with a charging inlet 31 through which the material chamber 3 is communicated with the main furnace chamber 1. The material chamber 3 is provided with a charging assembly 32 which is telescopically coupled to the charging inlet 31 for passing through the charging inlet 31 and charging materials to a crucible 11 in the main furnace chamber 1.

The single crystal furnace at least includes a main furnace chamber 1, an auxiliary furnace chamber 2 and a material chamber 3. Silicon material may be pulled to a single crystal in the main furnace chamber 1. As growth of the single crystal, the single crystal may form a monocrystalline silicon rod and gradually enter the auxiliary furnace chamber 2. An insulation valve between the main furnace chamber 1 and the auxiliary furnace chamber 2 is then closed. At this time, the monocrystalline silicon rod is left in the auxiliary furnace chamber 2 so as to be taken out.

Charging operation may be realized through the material chamber 3. In an embodiment of the present disclosure, the charging assembly 32 in the material chamber 3 may charge the silicon material into the crucible 11 through the charging inlet 31. The charging operation through the charging inlet 31 and the operation of taking out the monocrystalline silicon rod from the auxiliary furnace chamber 2 do not interfere with each other. Therefore, it is not necessary to wait for the monocrystalline silicon rod to be completely taken out from the auxiliary furnace chamber 2 before charging. When the monocrystalline silicon rod is being taken out or to be taken out, the charging assembly 32 may be started to charge, so that the taking out operation and the charging operation of the monocrystalline silicon rod may be performed simultaneously. Therefore, when the monocrystalline silicon rod is completely taken out from the auxiliary furnace chamber 2, a next cycle of crystal pulling process may be carried out.

Compared with the related art, by providing the material chamber 3, the single crystal furnace according to the present disclosure realizes the charging operation during taking out the monocrystalline silicon rod, so that the time consumed by taking out the monocrystalline silicon rod and the charging operation is effectively shortened, thereby improving production efficiency.

It should be noted that there may have one or two main furnace chambers 1. When two main furnace chambers 1 are provided, both of the two main furnace chambers 1 may be connected to one auxiliary furnace chamber 2 and one material chamber 3, and two charging assemblies 32 may be provided in the material chamber 3 to charge the crucibles 11 in the two main furnace chambers 1, respectively. The two main furnace chambers 1 may simultaneously perform the crystal pulling process or alternately perform the crystal pulling process. The monocrystalline silicon rods formed by the crystal pulling process may be taken out from the auxiliary furnace chamber 2. Therefore, by cooperation of the double main furnace chambers 1 with the auxiliary furnace chamber 2 and the material chamber 3, production capacity may be expanded and production efficiency may be improved.

It is appreciated that, there may have two or more main furnace chambers 1, and structures of the auxiliary furnace chamber 2 and the material chamber 3 may be modified according to the number of the main furnace chamber 1, which is not limited in the present disclosure.

In an embodiment of the present disclosure, the charging assembly 32 includes a material feeding channel 321 and a slide member 322 that are slidably connected to each other. The material feeding channel 321 is telescopically coupled to the charging inlet 31 by the slide member 322. As an example, the slide member 322 may be implemented as a slide rail 322.

During charging materials, the material feeding channel 321 may move along the slide member 322 toward the main furnace chamber 1. The material feeding channel 321 may pass through the charging inlet 31 so as to place a discharge end of the material feeding channel 321 above the crucible 11, so that the silicon material in the material feeding channel 321 may be added to the crucible 11. After the charging operation is completed, the material feeding channel 321 moves along the slide member 322 into the material chamber 3 so as to store the silicon material to be added to the crucible 11 for next time use.

Figure 2:
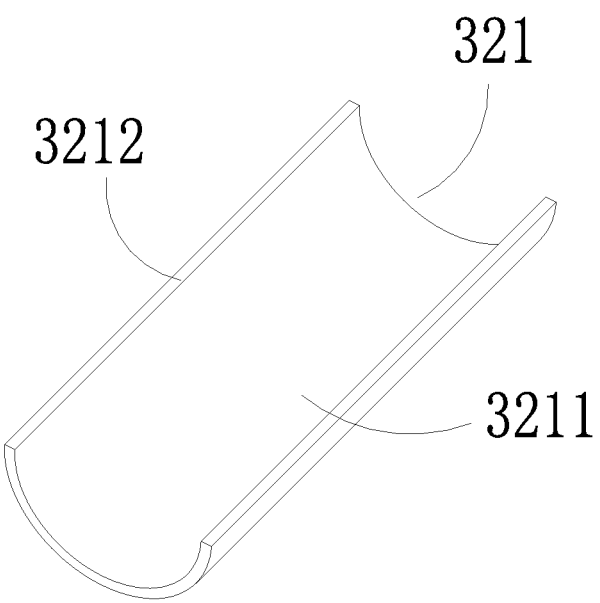
FIG. 2 is a structural schematic diagram showing a material feeding channel.
Figure 3:
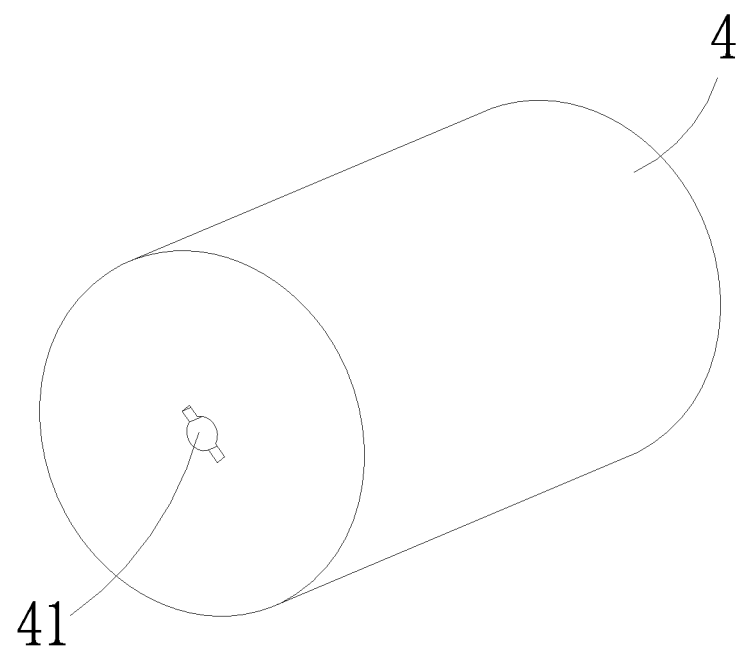
FIG. 3 is a structural schematic diagram showing a thermal insulation structure according to an embodiment of the present disclosure.
Figure 4:
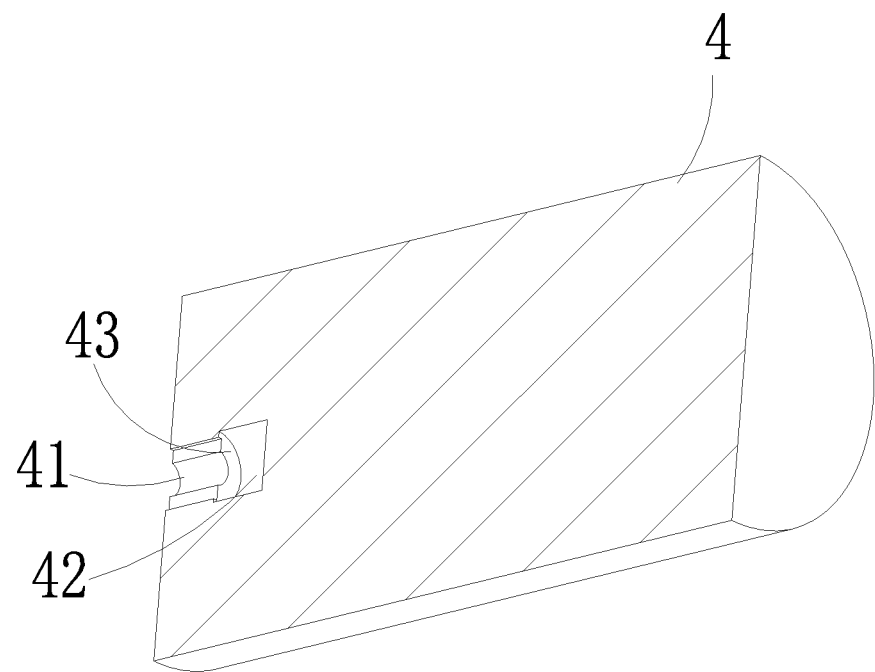
FIG. 4 is a half cross-sectional view I showing the thermal insulation structure according to an embodiment of the present disclosure.
Figure 5:
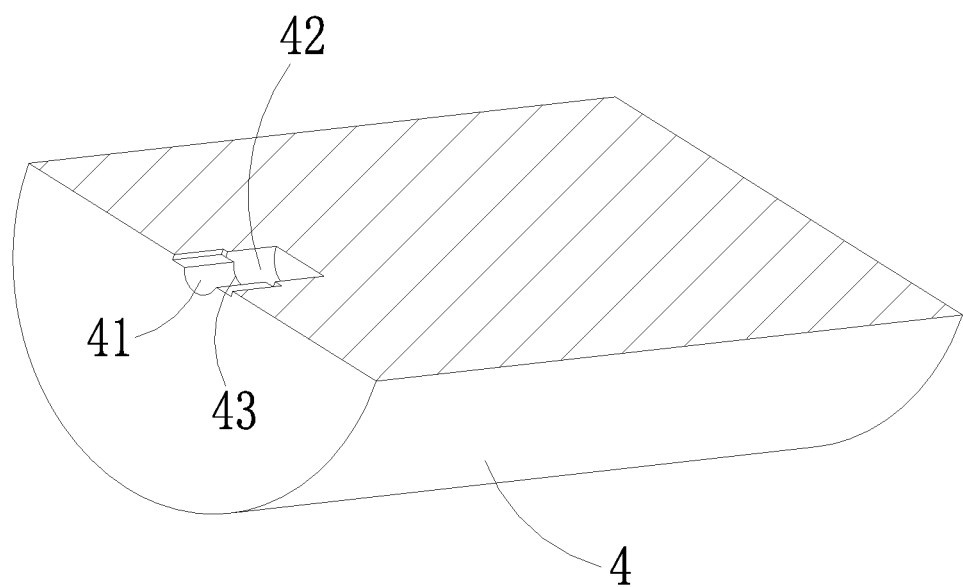
FIG. 5 is a half cross-sectional view II showing the thermal insulation structure according to an embodiment of the present disclosure.

As shown in FIG. 2, a material chute 3211 is formed in the material feeding channel 321, and the silicon material may be contained in the material chute 3211. The material chute 3211 may extend in a length direction of the material feeding channel 321, so that the amount of silicon material may be increased, thereby reducing the number of cycles of material charging. The chute 3211 has a cross section being an arc shape or a rectangular shape. It is appreciated that, the cross section may be other polygonal shapes. In this embodiment, the cross section of the chute 3211 has a semicircular arc shape.

In an embodiment of the present disclosure, as shown from FIG. 2 to FIG. 7, the charging assembly further includes a thermal insulation structure. The thermal insulation structure includes a thermal insulation structure 4 and a pushrod 5 which will be described in detail below. The thermal insulation structure is slidably provided on the material feeding channel 321. The thermal insulation structure may be sealingly cooperated with the charging inlet 31.

When the crucible 11 needs to be charged through the charging inlet 31, a discharge end of the material feeding channel 321 passes through the charging inlet 31, and the thermal insulation structure is placed at a position facing away from the charging inlet 31. When the charging operation is completed, the material feeding channel 321 is retracted into the material chamber 3. Meanwhile, the thermal insulation structure may slide to the charging inlet 31 relative to the material feeding channel 321 to block the charging inlet 31, so that excessive heat loss at the charging inlet 31 may be avoided, thereby ensuring uniformity of an overall thermal field of the main furnace chamber 1.

As shown from FIG. 3 to FIG. 7, the thermal insulation structure may include a thermal insulation structure 4 and a pushrod 5. The pushrod 5 is detachably connected to the thermal insulation structure 4. In this way, the thermal insulation structure 4 may be pushed by the pushrod 5 so that the thermal insulation structure 4 may block or open the charging inlet 31.

In practical operation, when the crucible 11 is required to charge materials, the pushrod 5 may be pulled to move the thermal insulation structure 4 relative to the material feeding channel 321 to a position facing away from the charging inlet 31 under driven of the pushrod 5. When the charging operation is completed, the pushrod 5 may be pushed to block the thermal insulation structure 4 in the charging inlet 31 under driven of the pushrod 5 in order to seal the thermal field of the main furnace chamber 1.

In order to improve sealing effect of the thermal insulation structure 4 for the charging inlet 31, the thermal insulation structure 4 may be made of graphite.

In an embodiment of the present disclosure, as shown from FIG. 3 to FIG. 7, the thermal insulation structure 4 is provided with a guide hole 41 and a rotation hole 42 axially communicated with the rotation hole 42. An end surface of the thermal insulation structure 4 is exposed at a side of the guide hole 41, and the rotation hole 42 has a radial dimension greater than the guide hole 41. A connection portion 51 is provided at an end of the pushrod 5, the connection portion 51 passes through the guide hole 41 and is then clamped in the rotation hole 42.

Since the radial dimension of the rotation hole 42 is greater than that of the guide hole 41, a first stepped surface 43 is formed at a position where the rotation hole 42 and the guide hole 41 are connected. An edge 3212 of the connection portion 51 protrudes from a body portion of the pushrod 5, so that a second stepped surface 52 is formed between the connection portion 51 and the body portion of the pushrod 5. When the connection portion 51 passes through the guide hole 41 and is placed in the rotation hole 42, the pushrod 5 may be appropriately rotated, so that the first stepped surface 43 may abut against the second stepped surface 52 to fixedly clamp the pushrod 5 and the thermal insulation structure 4.

Figure 6:
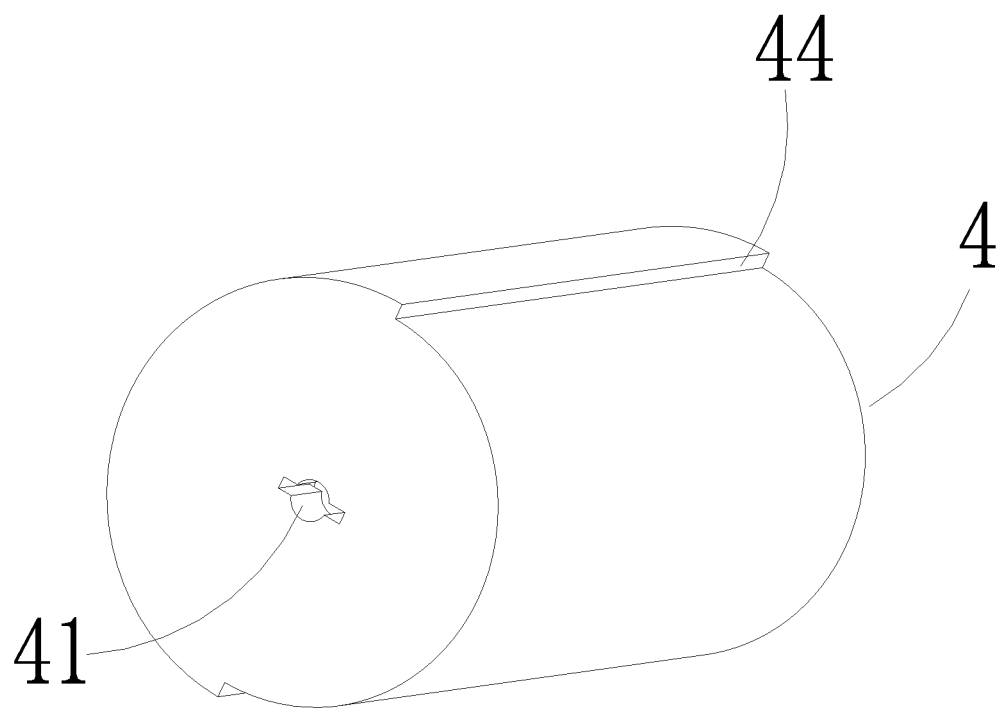
FIG. 6 is a structural schematic diagram showing a thermal insulation structure according to another embodiment of the present disclosure.
Figure 7:
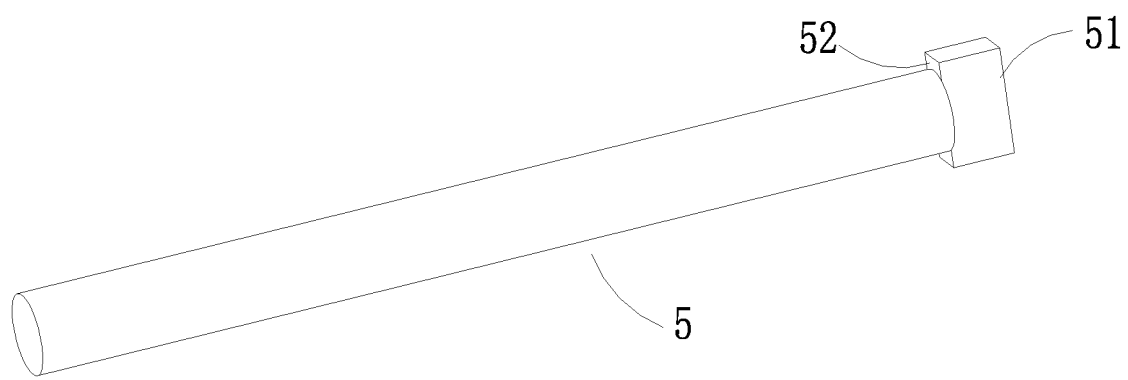
FIG. 7 is a structural schematic diagram showing a pushrod according to an embodiment of the present disclosure.

In an embodiment of the present disclosure, as shown from FIG. 2 and FIG. 6, a material chute 3211 is formed in the material feeding channel 321, and the thermal insulation structure 4 is slidingly connected to the material chute 3211. A boss 44 is provided on a side wall of the thermal insulation structure 4. The thermal insulation structure 4 is lapped on the edge 3212 of the chute 3211 through the boss 44.

After the thermal insulation structure 4 is cooperated with the material chute 3211, the boss 44 may be lapped on the edge 3212 of the material chute 3211, so that the boss 44 may prevent the thermal insulation structure 4 from rotating at will, thereby improving moving stability of the thermal insulation structure 4 controlled by the pushrod 5.

Figure 8:
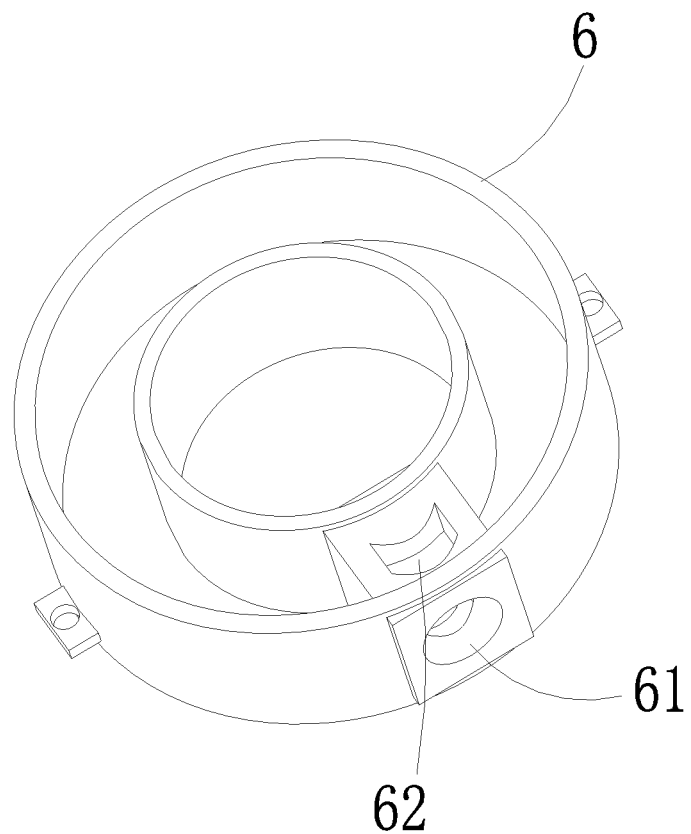
FIG. 8 is a structural schematic diagram showing a thermal insulation box according to an embodiment of the present disclosure.
Figure 9:
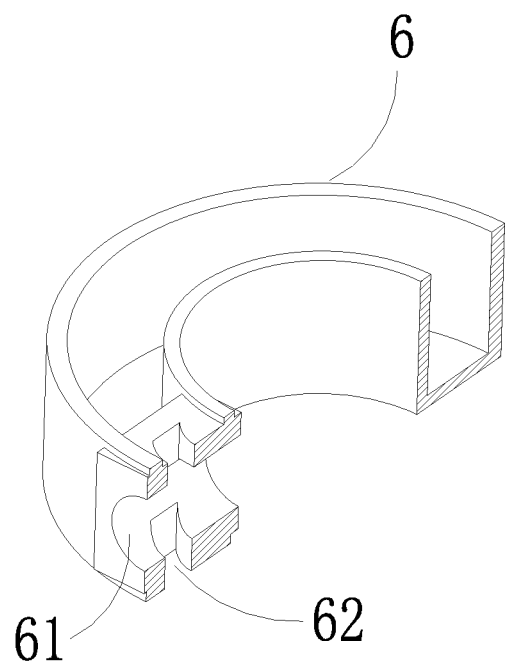
FIG. 9 is a half cross-sectional view showing the thermal insulation box according to an embodiment of the present disclosure.
Figure 10:
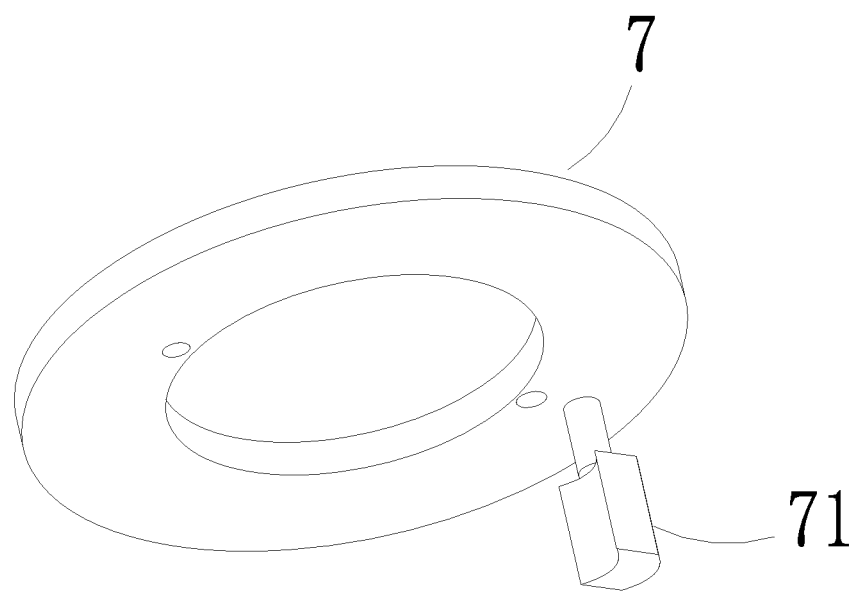
FIG. 10 is a structural schematic diagram showing a thermal insulation cover plate according to an embodiment of the present disclosure.

In an embodiment of the present disclosure, as shown from FIG. 8 to FIG. 10, a thermal insulation box 6 and a thermal insulation cover plate 7 are fixedly provided in the main furnace chamber 1. The thermal insulation box 6 is provided with a charging passage 61 and a sealing passage 62. The charging passage 61 abuts the charging inlet 31. The sealing passage 62 is communicated with the charging passage 61. A sealing plug 71 is provided on the thermal insulation cover plate 7. The sealing plug 71 sealingly cooperates with the sealing passage 62 for opening or blocking the charging passage 61.

The main furnace chamber 1 is provided with a guide tube lifter. The thermal insulation cover plate 7 may be connected to the lifter so as to drive the thermal insulation cover plate 7 to move under driven of the lifter. The thermal insulation box 6 is fixed in the main furnace chamber 1, and the thermal insulation cover plate 7 may be cooperated with or separated from the thermal insulation box 6 under driven of the above-mentioned lifter. When the thermal insulation cover plate 7 is separated from the thermal insulation box 6, the charging passage 61 is communicated with the charging inlet 31, and the discharge end of the charging channel 321 may successively pass through the charging inlet 31 and the charging passage 61, and be placed above the crucible 11 in order to charge materials. When the charging operation is completed, the material feeding channel 321 is retracted into the material chamber 3, and the thermal insulation structure 4 may be pushed by the pushrod 5 to seal the charging inlet 31. Meanwhile, the thermal insulation cover plate 7 is driven by the above-mentioned lifter to cooperate with the thermal insulation box 6 so as to make the sealing plug 71 on the thermal insulation cover plate 7 be inserted into the sealing passage 62, thereby sealing the charging passage 61. In this way, the thermal insulation structure 4 and cooperation of the thermal insulation box 6 and the thermal insulation cover plate 7 may effectively ensure uniformity of the thermal field in the main furnace chamber 1.

In order to facilitate the sealing plug 71 on the thermal insulation cover plate 7 to be moved in or out of the sealing passage 62, the sealing passage 62 may be perpendicularly communicated with the charging passage 61.

In an embodiment of the present disclosure, a heat insulation valve may be provided at a position of the main furnace chamber 1 aligned with the charging inlet 31. Insulation between the main furnace chamber 1 and the material chamber 3 may be realized by the heat insulation valve, which is helpful to temperature control of the main furnace chamber 1 or the material chamber 3.

In an embodiment of the present disclosure, as shown in FIG. 1, a vibration platform 34 and a vibration generator are provided in the material chamber 3. A dynamic end of the vibration generator is connected to the vibration platform 34. The vibration platform 34 is connected to the material feeding channel 321.

When the discharge end of the material feeding channel 321 is placed above the crucible 11, the vibration generator may be started. The vibration platform 34 drive the material feeding channel 321 to vibrate, so that the silicon material in the material feeding channel 321 may be continuously dropped into the crucible 11 from the discharge end of the material feeding channel 321 after being vibrated, to achieve material charging.

In an embodiment of the present disclosure, as shown in FIG. 1, a charging barrel 33 is further provided in the material chamber 3. The charging barrel 33 is located above the material feeding channel 321. A discharge hole is provided at the bottom of the charging barrel 33 and is opposite to the material feeding channel 321.

The charging barrel 33 may have a relatively large volume and may store a large amount of silicon material therein. The charging barrel 33 may supply materials to the material chute 3211 of the material feeding channel 321 through the discharge hole 331 at its bottom, and then charge materials into the crucible 11 through the material feeding channel 321.

In order to facilitate control of the amount of silicon material supplied to the material chute 3211, a valve may be provided at the discharge hole 331 on the charging barrel 33, so that release and cut off of the silicon material are realized by controlling open and close of the valve.

As shown in FIG. 1, the material chamber 3 may be provided at a side of the main furnace chamber 1. A side wall surface of the charging barrel 33 facing away from the main furnace chamber 1 is a vertical plane and forms a side wall of the discharge hole 331.

Since the charging assembly 32 needs to translate back and forth in a lateral direction of the main furnace chamber 1 in order to charge the main furnace chamber 1 from the charging assembly 32, a certain space is required to be reserved between the material chamber 3 and the main furnace chamber 1 so as to meet stroke of the charging assembly 32, so that a space between the charging barrel 33 and the main furnace chamber 1 may not be fully utilized. Moreover, the existing material barrel for storing materials is usually of a revolving structure, and a mouth of the material barrel is located in the center, which causes the barrel to occupy the space around the mouth.

For this purpose, in this embodiment, by configuring the side wall surface of the charging barrel 33 facing away from the main furnace chamber 1 as a vertical plane, and by forming the side wall of the discharge hole 331 by the wall surface, the space occupied by the charging barrel 33 facing away from the main furnace chamber 1 may be reduced. Meanwhile, the space of the charging barrel 33 may be expanded toward a side close to the main furnace chamber 1, so that the space between the charging barrel 33 and the main furnace chamber 1 may be fully utilized.

In an embodiment of the present disclosure, a heater may be provided in the charging barrel 33. When liquid material is required to be added to the main furnace chamber 1, the material in the charging barrel 33 may be melted in advance by the heater, and the melted material is then added into the material feeding channel 321 and then charged into the main furnace chamber 1, so that there is no need to melt the material in the main furnace chamber 1, thereby saving melting time of the silicon material and improving production efficiency.

Figure 11:
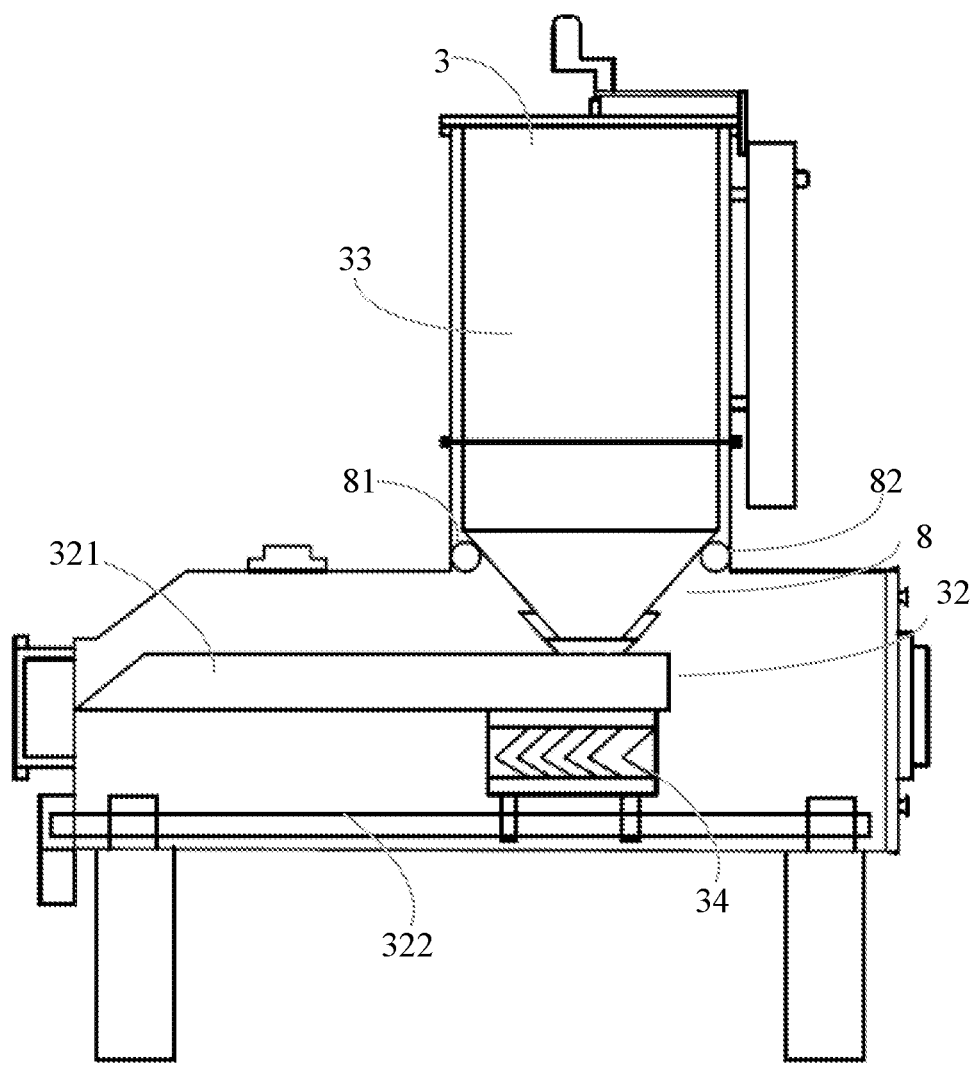
FIG. 11 is a structural schematic diagram showing a material chamber according to an embodiment of the present disclosure.
Figure 12:
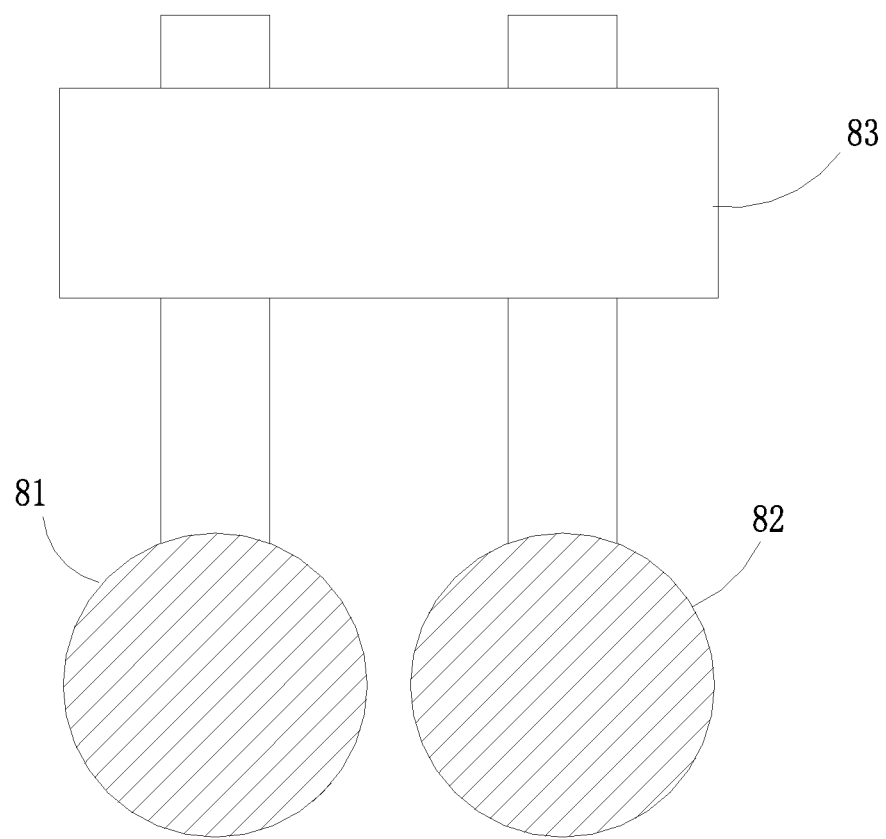
FIG. 12 is a schematic diagram showing a crusher according to an embodiment of the present disclosure.

In an embodiment of the present disclosure, as shown in FIG. 11 and FIG. 12, the material chamber 3 is further provided with a crusher 8 located between the charging barrel 33 and the material feeding channel 321.

When solid material is required to be added, solid silicon material is generally in a shape of non-uniform blocks having different sizes. The oversized silicon blocks are not easily melt for pulling crystals. For this purpose, by providing the crusher 8 between the charging barrel 33 and the material feeding channel 321, the silicon block with a larger size may be crushed into silicon blocks with a smaller size when passing through the crusher 8, so that sizes of the silicon blocks contained in the material feeding channel 321 are uniform, thereby facilitating crystal pulling.

As shown in FIG. 11 and FIG. 12, the crusher 8 may include a drive, an active roller 81 and a passive roller 82. The active roller 81 is provided with a first tooth. The passive roller 82 is provided with a second tooth meshed with the first tooth. The drive is configured to drive the active roller 81 and the passive roller 82 to rotate toward each other.

When the silicon block with a larger size passes through the position between the driving roller 81 and the passive roller 82, it may be crushed into silicon blocks with a smaller size through a meshing action between the first tooth and the second tooth. It is appreciated that, the active roller 81 and the passive roller 82 may be provided with convex structures such as annular ribs. Crushing the silicon blocks may be realized by cooperation of the convex structures on the active roller 81 and the passive roller 82, which is not limited to the first tooth and the second tooth in this embodiment.

The above embodiments of the present disclosure are only some of the embodiments, but not intended to limit the scope of the present disclosure. Any change, alternative and modification may be made by those skilled in the art without departing from the scope of the present application. The protection scope of the present disclosure is defined by the appended claims.

What is claimed is:

1. A single crystal furnace, comprising:
a main furnace chamber;
an auxiliary furnace chamber communicating with the main furnace chamber; and
a material chamber provided with a charging inlet and a charging assembly,
wherein the material chamber is communicated with the main furnace chamber through the charging inlet, the charging assembly is telescopically coupled to the charging inlet for charging materials into a crucible in the main furnace chamber,
wherein the charging assembly comprises a material feeding channel and a slide member, the material feeding channel is slidable on the slide member, and the material feeding channel is telescopically coupled to the charging inlet by the slide member, and
wherein the charging assembly further comprises a thermal insulation structure having a substantial cylinder shape and a pushrod detachably connected to the thermal insulation structure, the thermal insulation structure is slidable on the material feeding channel by means of the pushrod, and the thermal insulation structure is sealingly cooperated with the charging inlet,
wherein the thermal insulation structure is slidably connected to a material chute of the material feeding channel, the material chute having an arc shape matching the substantial cylinder shape of the thermal insulation structure, and
a boss is provided on a side wall of the thermal insulation structure, and the thermal insulation structure is lapped on an edge of the material chute by the boss.

2. The single crystal furnace according to claim 1, wherein the thermal insulation structure is provided with a guide hole and a rotation hole axially communicated with the guide hole, an end surface of the thermal insulation structure is exposed at a side of the guide hole, and the rotation hole has a radial dimension greater than the guide hole, and
a connection portion is provided at an end of the pushrod, the connection portion passes through the guide hole and is then clamped in the rotation hole.

3. The single crystal furnace according to claim 2, wherein a first stepped surface is formed at a position where the rotation hole and the guide hole are connected, an edge of the connection portion protrudes from a body portion of the pushrod to form a second stepped surface between the connection portion and the body portion of the pushrod, the pushrod is rotatable when the connection portion passes through the guide hole and is placed in the rotation hole, to abut the second stepped surface against the first stepped surface to fixedly clamp the pushrod with the thermal insulation structure.

4. The single crystal furnace according to claim 1, wherein a thermal insulation box and a thermal insulation cover plate are fixedly provided in the main furnace chamber, a charging passage and a sealing passage are provided on the thermal insulation box, the charging passage abuts with the charging inlet, and the sealing passage is communicated with the charging passage, and a sealing plug is provided on the thermal insulation cover plate and sealingly cooperates with the sealing passage for opening or blocking the charging passage.

5. The single crystal furnace according to claim 1, wherein a heat insulation valve is provided at a position of the main furnace chamber aligned with the charging inlet.

6. The single crystal furnace according to claim 1, wherein the material chamber is further provide with a vibration platform and a vibration generator, a dynamic end of the vibration generator is connected to the vibration platform, and the vibration platform is connected to the material feeding channel.

7. The single crystal furnace according to claim 1, wherein the material chamber is further provided with a charging barrel located above the material feeding channel, and a discharge hole is provided at the bottom of the charging barrel and facing the material feeding channel.

8. The single crystal furnace according to claim 7, wherein the material chamber is provided at a side of the main furnace chamber, and a side wall surface of the charging barrel facing away from the main furnace chamber is a vertical plane that forms a side wall of the discharge hole.

9. The single crystal furnace according to claim 7, wherein the charging barrel is provided with a heater.

10. The single crystal furnace according to claim 7, wherein the material chamber is further provided with a crusher located between the charging barrel and the material feeding channel.

11. The single crystal furnace according to claim 10, wherein the crusher comprises a drive, an active roller and a passive roller, the active roller is provided with a first tooth, the passive roller is provided with a second tooth meshed with the first tooth, and
the drive is configured to drive the active roller and the passive roller to rotate toward each other.

12. A single crystal furnace, comprising:
a main furnace chamber;
an auxiliary furnace chamber communicating with the main furnace chamber; and
a material chamber provided with a charging inlet and a charging assembly,
wherein the material chamber is communicated with the main furnace chamber through the charging inlet, the charging assembly is telescopically coupled to the charging inlet for charging materials into a crucible in the main furnace chamber,
wherein the charging assembly comprises a material feeding channel and a slide member, the material feeding channel is slidable on the slide member, and the material feeding channel is telescopically coupled to the charging inlet by the slide member, and
wherein the charging assembly further comprises a thermal insulation structure having a substantial cylinder shape and a pushrod detachably connected to the thermal insulation structure, the thermal insulation structure is slidable on the material feeding channel by means of the pushrod, and the thermal insulation structure is sealingly cooperated with the charging inlet,
wherein a thermal insulation box and a thermal insulation cover plate are fixedly provided in the main furnace chamber, a charging passage and a sealing passage are provided on the thermal insulation box, the charging passage abuts with the charging inlet, and the sealing passage is communicated with the charging passage, and a sealing plug is provided on the thermal insulation cover plate and sealingly cooperates with the sealing passage for opening or blocking the charging passage.

13. A single crystal furnace, comprising:

a main furnace chamber;

an auxiliary furnace chamber communicating with the main furnace chamber; and a material chamber provided with a charging inlet and a charging assembly, wherein the material chamber is communicated with the main furnace chamber through the charging inlet, the charging assembly is telescopically coupled to the charging inlet for charging materials into a crucible in the main furnace chamber, wherein the charging assembly comprises a material feeding channel and a slide member, the material feeding channel is slidable on the slide member, and the material feeding channel is telescopically coupled to the charging inlet by the slide member, and wherein the charging assembly further comprises a thermal insulation structure having a substantial cylinder shape and a pushrod detachably connected to the thermal insulation structure, the thermal insulation structure is slidable on the material feeding channel by means of the pushrod, and the thermal insulation structure is sealingly cooperated with the charging inlet, wherein the thermal insulation structure is provided with a guide hole and a rotation hole axially communicated with the guide hole, an end surface of the thermal insulation structure is exposed at a side of the guide hole, and the rotation hole has a radial dimension greater than the guide hole, and a connection portion is provided at an end of the pushrod, the connection portion passes through the guide hole and is then clamped in the rotation hole, and wherein a first stepped surface is formed at a position where the rotation hole and the guide hole are connected, an edge of the connection portion protrudes from a body portion of the pushrod to form a second stepped surface between the connection portion and the body portion of the pushrod, the pushrod is rotatable when the connection portion passes through the guide hole and is placed in the rotation hole, to abut the second stepped surface against the first stepped surface to fixedly clamp the pushrod with the thermal insulation structure.

* * * * *